(12) United States Patent
Banerjee et al.

(10) Patent No.: US 9,842,923 B2
(45) Date of Patent: Dec. 12, 2017

(54) OHMIC CONTACT STRUCTURE FOR SEMICONDUCTOR DEVICE AND METHOD

(71) Applicant: Semiconductor Components Industries, LLC, Phoenix, AZ (US)

(72) Inventors: Abhishek Banerjee, Mechelen (BE); Peter Moens, Zottegem (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 487 days.

(21) Appl. No.: 14/191,030

(22) Filed: Feb. 26, 2014

(65) Prior Publication Data

US 2014/0264454 A1   Sep. 18, 2014

Related U.S. Application Data

(60) Provisional application No. 61/786,653, filed on Mar. 15, 2013.

(51) Int. Cl.
| | |
|---|---|
| *H01L 29/66* | (2006.01) |
| *H01L 29/778* | (2006.01) |
| *H01L 29/40* | (2006.01) |
| *H01L 29/20* | (2006.01) |

(52) U.S. Cl.
CPC ........ *H01L 29/7786* (2013.01); *H01L 29/402* (2013.01); *H01L 29/66462* (2013.01); *H01L 29/2003* (2013.01)

(58) Field of Classification Search
CPC ........... H01L 29/7786; H01L 29/66462; H01L 29/402
USPC ............................ 257/194, 280, 76; 438/172
See application file for complete search history.

(56) References Cited

U.S. PATENT DOCUMENTS

| | | | |
|---|---|---|---|
| 2007/0132037 A1* | 6/2007 | Hoshi | ............... H01L 21/28587 257/396 |
| 2011/0210338 A1 | 9/2011 | Briere | |
| 2012/0223317 A1* | 9/2012 | Bahl | .................. H01L 29/4175 257/76 |

OTHER PUBLICATIONS

Hidekazu Umeda et al., Blocking-Voltage Boosting Technology for GaN Transistors by Widening Depletion Layer in Si Substrates, 2010, IEEE.
Yasuhiro Uemoto et al., 8300V Blocking Voltage AlGaN/GaN Power HFET with Thick Poly-AlN Passivation, 861, 2001, IEEE.

* cited by examiner

*Primary Examiner* — Jamie C Niesz
(74) *Attorney, Agent, or Firm* — Kevin B. Jackson (57) ABSTRACT

In one embodiment, a high electron mobility device structure includes heterostructure with a Group III-nitride channel layer and a Group III-nitride barrier layer that forms a two-dimensional electron gas layer at an interface between the two layers. At least one current carrying electrode includes a recess-structured conductive contact adjoining and making Ohmic contact with the two-dimensional electron gas layer. The recess-structured conductive contact has at least one side surface defined to have a rounded wavy shape.

16 Claims, 6 Drawing Sheets

OHMIC CONTACT STRUCTURE FOR SEMICONDUCTOR DEVICE AND METHOD

CROSS REFERENCE TO RELATED APPLICATION

This application claims the benefit of U.S. Provisional Application No. 61/786,653 filed Mar. 15, 2013.

BACKGROUND

Embodiments disclosed herein relate generally to electrical technology, and more specifically to a semiconductor component and method of fabricating the same.

In the past, semiconductor heterostructure devices were commonly used in high-speed, low-noise, and power applications. A High Electron Mobility Transistor (HEMT) is a type semiconductor heterostructure device that has a current path formed by a two-dimensional electron gas (2DEG) layer generated at the interface between two types of semiconductor films having different band gaps. The 2DEG layer typically represents a sheet of electrons where electrons are confined and can move freely within two dimensions but are limited in movement in a third dimension.

Typical HEMT devices have comprised a channel-forming layer formed on a substrate and a Schottky layer formed on the channel-forming layer. Films having different band gaps are used as the channel-forming layer and the Schottky layer. For example, a gallium nitride (GaN) film has been used as the channel-forming layer, and an aluminum gallium nitride (AlGaN) film has been used as the Schottky layer, which forms the 2DEG layer at the interface between the channel-forming layer and the Schottky layer. A cap layer has been formed on the surface of the Schottky layer. A source electrode, a drain electrode, and a gate electrode have been disposed on the cap layer. The source electrode and drain electrode have been Ohmic electrodes that provide electrical connection through one or more of the layers to the 2DEG layer.

An appropriate potential applied to the gate electrode forms a depletion layer in the 2DEG layer. The depletion layer controls current flowing between the source electrode and the drain electrode. Electron mobility in the 2DEG layer is much greater than that of a normal semiconductor such as bulk silicon, which allows the HEMT to operate at a higher speed compared to a typical silicon based field effect transistor (FET).

The current flow between two lateral Ohmic electrodes is directly proportional to the surface perimeter of the electrodes. In the past, conventional approaches have used only a portion of the Ohmic contact length for conduction for electrically long contacts. Specifically, in conventional approaches a major portion of the current density passes through a front edge of the contact only with the remaining portion of the contact being used for only a minor portion of the current density leading to unnecessary wastage of area. Conventional approaches to solving this problem have included increasing the active area (width) of the heterostructure devices to enhance the surface area of the Ohmic contacts. Unfortunately, such approaches have led to the heterostructure devices having an undesired higher specific on-resistance ($R_{DSON}$).

Accordingly, it would be desirable to have a structure and method that improves the characteristics of heterostructure semiconductor devices by effectively reducing the contact resistance by increasing the surface perimeter of the contact area, while maintaining substantially the same device dimension between the Ohmic contacts and 2DEG layer without causing current crowding, self-heating, and/or other performance issues.

For simplicity and clarity of the illustration(s), elements in the figures are not necessarily to scale, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of a MOS transistor or an emitter or a collector of a bipolar transistor or a cathode or anode of a diode, and a control electrode means an element of the device that controls current through the device such as a gate of a MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, and that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there can be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description may illustrate a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

In general, the present embodiments relate to a high electron mobility (HEM) semiconductor device structure and a method of forming the structure. The HEM device structure includes a base semiconductor substrate and a heterostructure associated with the base substrate. In some embodiments, the heterostructure is a Group III-nitride series material such as gallium nitride (GaN), aluminum gallium nitride (AlGaN), indium nitride (InN), aluminum nitride (AlN), indium gallium nitride (InGaN), indium aluminum gallium nitride (InAlGaN), or similar materials as known to those of skill in the art. In some embodiments, a gate structure is provided adjacent a major surface of the heterostructure and first and second current carrying electrodes are on the major surface but spaced apart from the gate structure.

In some embodiments, the heterostructure includes a GaN channel layer and an AlGaN barrier layer that forms a two-dimensional electron gas layer at an interface between the two layers. In some embodiments, the current carrying electrodes are configured to have a recess-structured conductive contact adjoining and making Ohmic contact with the two-dimensional electron gas layer. For the purpose of overcoming the issues described previously with related devices, one or both of the recess-structured conductive contacts has a leading edge non-parallel to a channel width direction, the leading edge defined to have a wavelike form having generally rounded peaks and valleys. Among other things, this wavelike form increases the surface area of the contact used for current conduction thereby reducing contact resistance and increasing current density, while maintaining substantially the same device dimension. Also, the generally rounded peaks and valleys configuration produced an unexpected result of minimizing high electric field formation and current crowding around the contacts and reducing hot spot formation compared to related devices that use square wave, saw-tooth wave, or other shapes that have surfaces with sharp corners or points where such problems are known to occur.

Figure 1:
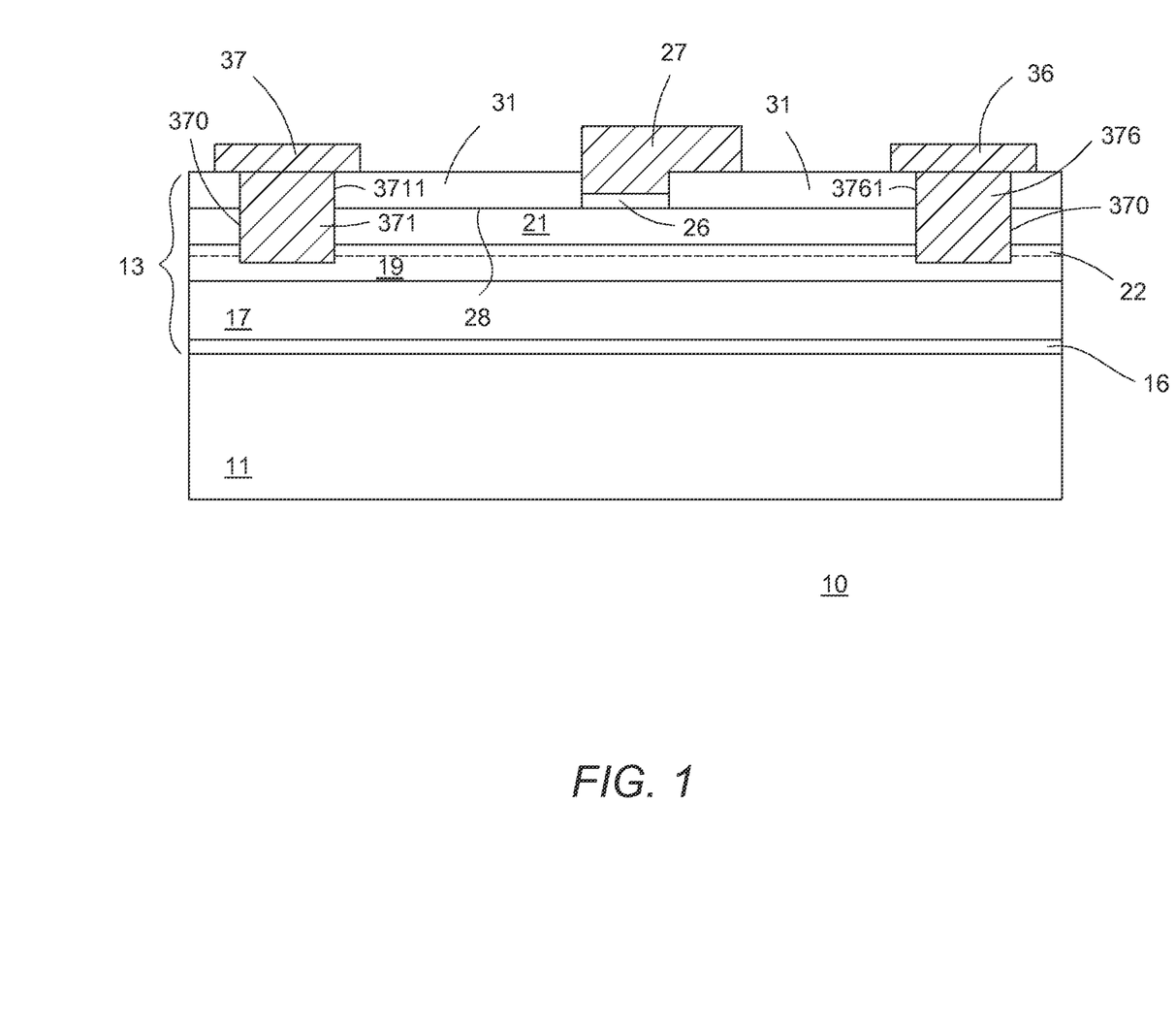
FIG. 1 illustrates a cross-sectional view of an embodiment of a high electron mobility semiconductor device in accordance with the present invention.

FIG. 1 illustrates an enlarged cross-sectional view of an embodiment of a semiconductor device 10 configured in the present embodiment as a Group III-nitride depletion mode high electron mobility transistor (HEMT). The cross-sectional view of FIG. 1 is taken along reference line 1-1 illustrated in FIG. 2, which illustrates a top view of transistor 10. Transistor 10 includes a base substrate, base semiconductor substrate, a region of semiconductor material, semiconductor region, or semiconductor substrate 11. In several embodiments, substrate 11 is a silicon substrate having a (111) orientation and is doped with a p-type dopant such as boron. In other embodiments, substrate 11 can have other orientations. In other embodiments, substrate 11 can be silicon-carbide, other semiconductor materials, insulating materials, or other materials as known to those of ordinary skill in the art. In other embodiments, substrate 11 can be doped with an n-type dopant such as phosphorus, arsenic, or antimony.

Transistor 10 also includes a heterostructure or epitaxial structure 13, which can be formed on substrate 11. In several embodiments, heterostructure 13 includes a plurality of layers including, for example, a nucleation or buffer layer 16; one or more buffer or transition layers 17; a first layer, channel-forming layer, or channel layer 19; and a second layer, a barrier layer, or Schottky layer 21. In some embodiments, buffer layer 16 can be, for example, an MN layer, situated over substrate 11. One or more transition layers 17, which can be optional in some embodiments, can be formed situated over buffer layer 16. In some embodiments, transition layers 17 can be, for example, AlGaN with varying amounts of aluminum concentration. For example, the aluminum concentration can be higher in the transition layers 17 closer to buffer layer 16 and lower closer to channel layer 19.

Channel layer 19 can be formed situated on transition layers 17. In several embodiments, channel layer 19 can be, for example, a GaN layer. In some embodiments, barrier layer 21 can be an AlGaN layer formed over channel layer 19. At the interface of the barrier layer 21 and the channel layer 19 a two-dimensional electron gas (2DEG) layer or region 22 is created, as known to those of ordinary skill in the art. In other embodiments, an MN layer (not shown) can be placed in between channel layer 19 and barrier layer 21. Heterostructure 13 can be formed using a metalorganic vapor phase epitaxy (MOVPE) process (also known as organometallic vapor phase epitaxy (OMVPE) or metalorganic chemical vapor deposition (MOCVD)), which is a chemical vapor deposition method used to produce single crystalline or polycrystalline thin films.

In some embodiments, transistor 10 further includes a gate dielectric layer or region 26 situated over a portion of barrier layer 21 as illustrated in FIG. 1. In other embodiments, transistor 10 can be configured with a Schottky gate with gate dielectric layer 26 omitted. In some embodiments, gate dielectric region 26 can be silicon nitride, aluminum nitride, aluminum oxide, silicon dioxide or combinations thereof, hafnium oxide, or other materials as known to those of ordinary skill in the art. A control or gate electrode 27 is situated over gate dielectric region 26, and can be, for example, aluminum with a titanium and/or titanium-nitride barrier or other conductive materials as known to those of ordinary skill in the art.

As illustrated in FIG. 1, transistor 10 can also include an insulating, insulation or insulative layer or layers 31 situated over portions of major surface 28 of heterostructure 13, which can be, for example, silicon nitride, aluminum nitride, combinations thereof, or other insulative materials as known to those of ordinary skill in the art. In some embodiments, insulation layer 31 can be silicon nitride formed using plasma-enhanced chemical vapor deposition techniques (PECVD), low pressure chemical vapor deposition (LP-CVD), MOCVD, atomic layer deposition (ALD), and can have a thickness in some embodiments from about 0.1 microns to about 0.2 microns. In some embodiments, the silicon nitride forms a field plate that reduces the effect of the high electric fields that can be formed between the drain and gate regions. Gate electrode 27 can extend to overlap onto the top surface of insulative layer 31 to provide a field plate structure, which is generally illustrated in FIG. 1.

In the present embodiment, a first recess-structured conductive contact, recess-structured Ohmic contact, or recess-structured Ohmic electrode 371 extends generally downward from major surface 28 to contact barrier layer 21 and make Ohmic contact to the 2DEG region 22. In some embodiments, recess-structured conductive contact 371 is configured as a source contact for transistor 10. A second recess-structured conductive contact, recess-structured Ohmic contact or recess-structured Ohmic electrode 376 extends generally downward from another portion of major surface 28 to contact barrier layer 21 and make Ohmic contact to the 2DEG region 22 at another location. In some embodiments recess-structured conductive contact 376 is configured as a drain contact for transistor 10. In one embodiment, recess-structured contacts 371 and 376 are formed in trenches or recessed regions 370 formed or etched into heterostructure 13 as will be described later. Although FIG. 1 illustrates recess-structured contacts 371 and 376 making direct contact to 2DEG region 22, it is understood that in other embodiments recess-structured contacts 371 and 376 may terminate in barrier layer 21 proximate to 2DEG region 22 to provide Ohmic contact.

As illustrated in FIG. 1, recess-structured contacts 371 and 376 are laterally spaced apart from each other and proximate to major surface 28 with gate electrode 27 disposed in between them. Recess-structured contact 371 and recess-structured contact 376 both have a leading edge (i.e., edge that is closest to the gate electrode or opposing electrode) or side 3711 and 3761 that is non-parallel to a channel width direction of transistor 10. This is illustrated, for example, in FIG. 2 with the channel width direction being generally referenced by directional arrow 20. In accordance with the present embodiment and generally illustrated in FIG. 2, leading edge 3711 has a rounded wavelike form 3715, which comprises a rounded-peak and valley wave shape, a wavelike form having generally rounded peaks (or protrusions) 201 and valleys (or recessed portions) 202, or a form having similar geometric representation as a sine wave. Leading edge 3711 is not configured as a square wave shape or a saw-tooth wave shape or other structures that have sharp points, sharp corners, or shapes that would create areas of high electric field stress. In some embodiments, leading edge or side 3761 is configured similarly to leading edge 3711. Although not shown, it is contemplated in other embodiments that trailing edges or side 3712 and 3762 may also have a similar shape as sides 3711 and 3761, for example, in embodiments using inter-digitated electrode designs.

Figure 2:
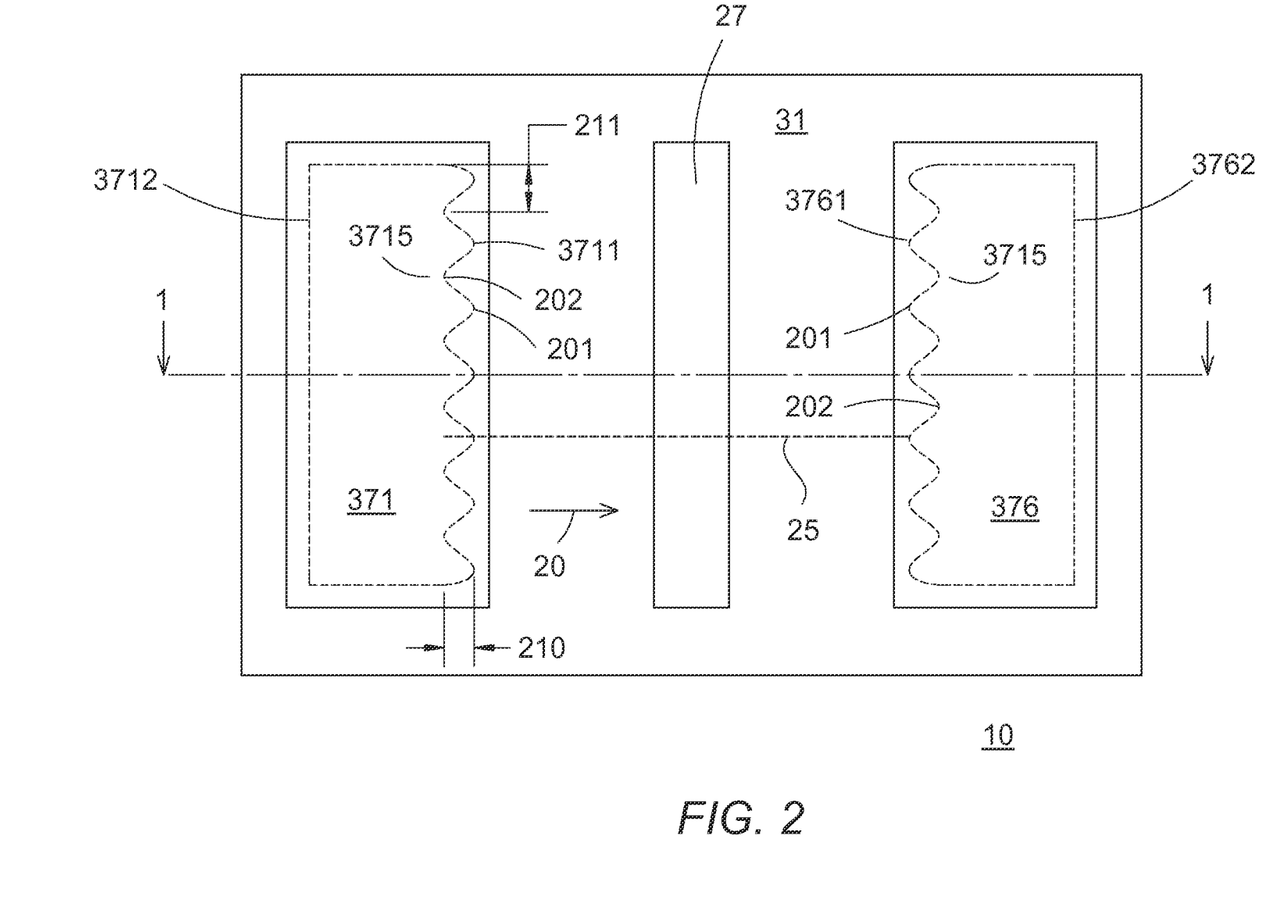
FIG. 2 illustrates a top view of the semiconductor device of FIG. 1.
Figure 3:
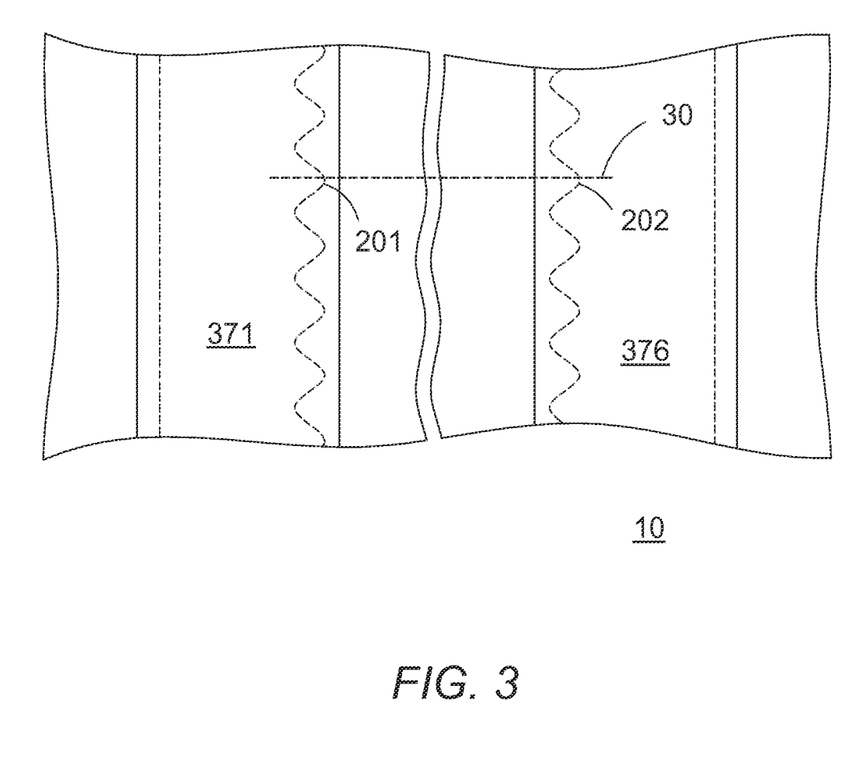
FIG. 3 illustrates a partial top view of an alternative embodiment of a semiconductor device in accordance with the present invention.

As illustrated in FIG. 2, the peaks or protrusions 201 and valleys or recessed portions 202 of shape 3715 can have a height or amplitude 210 and a width 211. In one embodiment, height 210 can be in a range from about 0.05 microns to about 3 microns. In one embodiment, width 211 can be in a range from about 0.05 microns to about 3 microns. Height 201 and width 211 can be further reduced and generally limited by lithography capabilities. In some embodiments, height 210 and width 211 can be equal. In other embodiments, height 210 and width 211 can be different. In one embodiment, both height 210 and width 211 can be about 2 microns, which was found to provide a more optimum contact resistance reduction. FIG. 2 also illustrates an embodiment where opposing peaks or protrusions 201 on leading edges 3711 and 3761 are symmetrical or in alignment as generally represented by dashed line 25. FIG. 3 illustrates a partial top view of alternative embodiment of transistor 10 where opposing peaks 201 on leading edges 3711 and 3761 are asymmetrical or offset (i.e., not in alignment) with respect to each other. In some embodiments, the peaks 201 of one leading edge are aligned with the valleys or recessed portions 202 of the opposing leading edge as generally represented by dashed line 30 in FIG. 3.

Recess-structured contacts 371 and 376 can be a conductive material configured to provide an Ohmic contact to 2DEG layer 22. In some embodiments, the recess-structured contacts 371 and 376 can be any suitable conductive structures, such as titanium, titanium nitride, aluminum, nickel, platinum, gold, tungsten, or combinations thereof. In one embodiment, recess-structured contacts 371 and 376 can be a laminate metal structure, for example, titanium/aluminum/titanium/titanium-nitride. In some embodiments, Ohmic contact or electrode 37 can be formed on insulative layer 31 and in Ohmic contact with recess-structured contact 371, and an Ohmic contact or electrode 36 can be formed on insulative layer 31 and in Ohmic contact with recess-structured contact 376. Electrodes 36 and 37 can be formed at the same time as recess-structured contacts 371 and 376, or they can be formed in a separate step. In some embodiments, electrode 36 is configured as a drain electrode and electrode 37 is configured as source electrode. In other embodiments, the gate structure (that is, gate electrode 27 and gate dielectric layer 26) is excluded and the HEM structure is used as a Schottky diode with recess-structured contact 371 and electrode 37 configured as an anode electrode and recess-structured contact 376 and electrode 36 configured as a cathode electrode, or vice versa.

In analyzing transistor 10, it was found that leading edge 3711 having the shape as illustrated in FIG. 2 results in about a 40% decrease in contact resistance compared to a contact having a generally straight leading edge. In addition, it was found that leading edge 3711 having protrusions 201 with a height 210 and a width 211 of about 1 micron had about a 51% reduction in resistance compared to a straight-edged contact of similar size; and a leading edge having protrusions 201 with a height 210 and a width 211 of about 2 microns had a about 58% reduction in resistance compared to a straight-edged contact of similar size.

Figure 4:
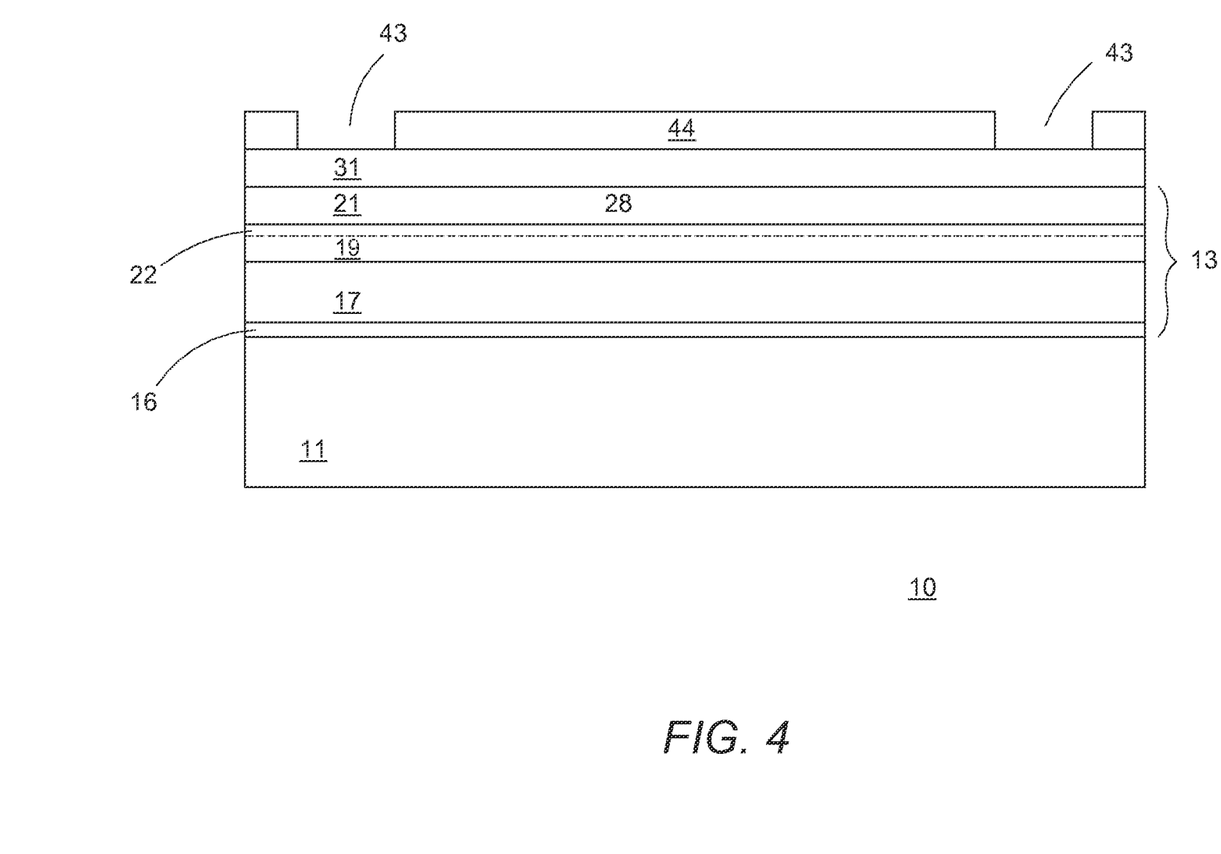
FIGS. 4-6 illustrate cross-sectional views of the semiconductor device of FIG. 1 at various stages of fabrication in accordance with the present invention.

Turning now to FIGS. 4-6, which are cross-sectional view of transistor 10 at various stages of fabrication, a method of forming transistor 10 is described. In FIG. 4, substrate 11 having heterostructure 13 is provided. In one embodiment, substrate 11 can be a silicon substrate having (111) orientation and can have a p-type conductivity. In one embodiment, heterostructure 13 can be a Group III-nitride structure where nucleation layer 16 can be MN and buffer layer 17 can be a plurality of AlGaN layers having lower aluminum concentration as buffer layer 17 approaches channel layer 19. In one embodiment, channel layer 19 can comprise GaN and barrier layer 21 can comprise AlGaN. As discussed previously, two-dimensional electron gas layer 22 forms proximate to the interface between channel layer 19 and barrier layer 21. In another embodiment, an MN layer (not shown) can be formed in between channel layer 19 and barrier layer 21. Heterostructure 13 can be formed using a MOCVD process. Insulative layer 31 can then formed proximate to major surface 28 of heterostructure 13. Insulative layer 31 can be any suitable dielectric material. In one embodiment, insulative layer 31 comprises a SiN/AlN/SiN structure and can be formed using PECVD, LPCVD, MOCVD, ALD, or other similar techniques. In one embodiment, a masking layer 44 is formed on insulative layer 31 and can be a patterned photoresist layer having Ohmic contact openings 43. In accordance with the present embodiment, openings 43 have the desired shape of recess-structured Ohmic contacts 371 and 376, such as the shapes illustrated in FIG. 2 or 3. Openings 43 expose portions of insulative layer 31 for further processing.

Figure 5:
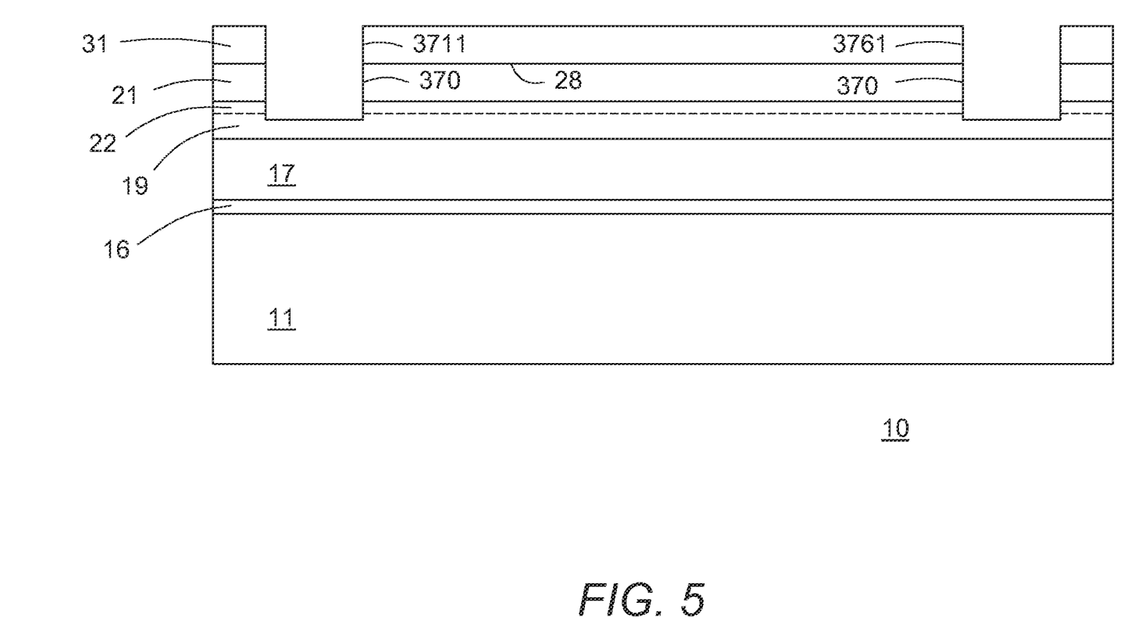

FIG. 5 illustrates transistor 10 after further processing. In one embodiment, the exposed portions of insulative layer 31 and portions of barrier layer 21 and channel layer 19 are removed to form trenches or recessed portions 370 extending generally downward into the structure as illustrated in FIG. 5. In some embodiments, trenches 370 can be dry etched using $SF_6$ and/or $BCl_3/SF_6$ etch chemistries. Masking layer 44 can then be removed using, for example, a photoresist stripping and cleaning process. As a result, trenches 370 are provided with the a rounded-peak and valley wave shape described previously for leading edge 3711 and/or leading edge 3761. In one embodiment, trenches 370 have a continuous and generally rectangular shape with two sets of opposing sidewalls. In some embodiments, trenches 370 have a rectangular tub shape. In some embodiments, trenches 370 have generally straight or generally perpendicular sidewalls. In other embodiments, trenches 370 can have some sidewalls or all sidewalls that are sloped. Following the formation of trenches 370, the exposed surfaces are cleaned using pre-metal cleaning techniques. In one embodiment, the exposed surfaces can be cleaned with a HCl based chemistry.

Figure 6:
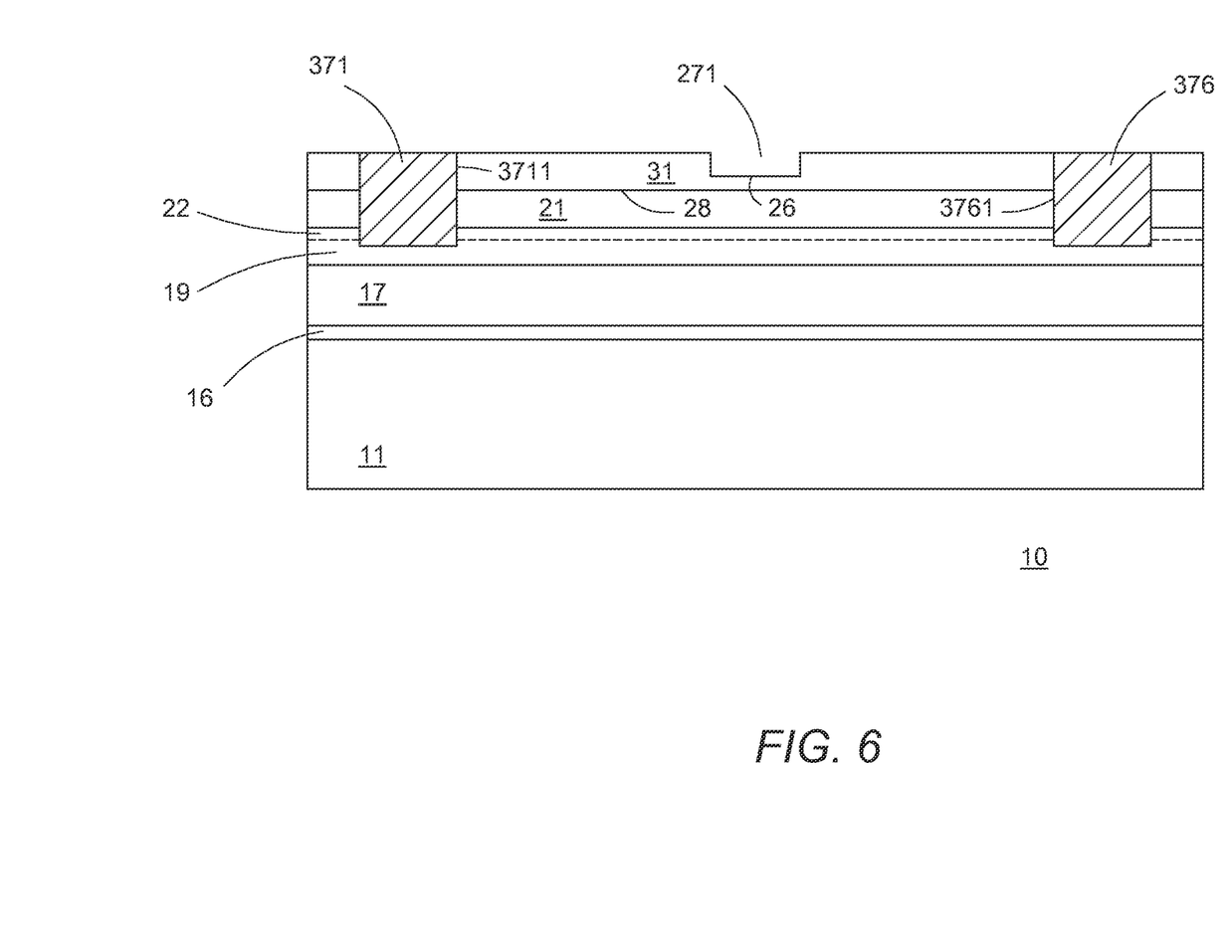

FIG. 6 illustrates transistor 10 after further processing to form recess-structured Ohmic contacts 371 and 376 in trenches 370. In one embodiment, sputter deposition techniques can be used to form contacts 371 and 376, which can be any suitable conductive material. In some embodiments, contacts 371 and 376 can be titanium, aluminum, nickel, gold, and/or tungsten. In one embodiment, contacts 371 and 376 can be a laminate structure of titanium/aluminum/titanium/titanium-nitride. Although contacts 371 and 376 are illustrated as generally filling trenches 370, in other embodiments contacts 371 and 376 can be conformal layers lining trenches 370. After the conductive material is deposited in trenches 370, the conductive material can be patterned using, for example, photolithographic and etch techniques to form recess-structured Ohmic contacts 371 and 376 having the rounded-peak and valley wave shape 3715 described previously for leading edge 3711 and/or leading edge 3761. In one embodiment, contacts 371 and 376 have a continuous and generally rectangular shape with two sets of opposing sidewalls.

In a subsequent step, a portion of insulative layer 31 can be recessed or etched to provide a gate electrode opening 271 and to provide gate dielectric layer or region 26 as generally illustrated in FIG. 6. Photolithographic and etch techniques can be used to form these features. In another embodiment, all of insulative material 31 can be removed and a different dielectric material or materials can be formed in the opening. In other embodiments, a Schottky gate structure is used with gate dielectric layer 26 omitted. In a later step, gate electrode 27 and Ohmic contacts or electrodes 36 and 37 can be formed as illustrated in FIG. 1. In one embodiment, sputter deposition techniques can be used to form electrodes 27, 36, and 37. In one embodiment electrodes 27, 36, and 37 can be laminate structures of titanium-nitride, aluminum-copper, and titanium nitride. It is understood that other suitable conductive materials can be used in alternative embodiments. After the electrode material is formed, photolithographic and etch techniques can be used to pattern electrodes 27, 36, and 37. Although not shown, additional insulation layers and conductive field plates can be added to transistor 10.

From all of the foregoing, one skilled in the art can determine that according to one embodiment, a semiconductor device (for example, element 10) comprises a channel-forming layer (for example, element 19) on a semiconductor substrate (for example, element 11); a barrier layer (for example, element 21) is on the channel-forming layer; a two-dimensional electron gas layer (for example, element 22) formed at an interface between the barrier layer and the channel-forming layer; a control electrode (for example, element 27) is in spaced relationship with the barrier layer; and a first recess-structured Ohmic electrode (for example, element 371, 376) containing a plurality of side faces that are in Ohmic contact with the two-dimensional electron gas layer and non-parallel to a channel width direction (for example, element 20), wherein a side (for example, element 3711, 3761) of the first recessed-structured Ohmic electrode is in Ohmic contact with the two-dimensional gas layer has a wavy shape (for example, element 3715).

Those skilled in the art will also appreciate that according to another embodiment, the structure can further comprise a gate dielectric layer (for example, element 26) between the control electrode and the barrier layer. In another embodiment, the structure can further comprise a second recess-structured Ohmic electrode (for example, elements 371, 376) containing a plurality of side faces that are in Ohmic contact with the two-dimensional electron gas layer and non-parallel to the channel width direction, wherein a side (for example, elements 3711, 3761) of the second recess-structured Ohmic electrode in Ohmic contact with the two-dimensional gas layer has a wavy shape (for example, element 3715). In a further embodiment, the side surface (for example, element 3711, 3761) of the first recess-structured Ohmic electrode having the wavy shape and the side surface (for example, element 3711, 3761) of the second recess-structured Ohmic electrode having the wavy shape face each other. In another embodiment of the structure the wavy shape of the first recess-structured Ohmic electrode can be symmetrical (for example, element 25) to the wavy shape of the second recess-structured Ohmic electrode. In yet another embodiment of the structure, the wavy shape of the first recess-structured Ohmic electrode can be asymmetrical (for example, element 30) to the wavy shape of the second recess-structured Ohmic electrode. In a further embodiment of the structure the first recess-structured Ohmic electrode can have a continuous and generally rectangular shape. In a still further embodiment of the structure the wavy shape can be defined by a plurality of rounded protrusions (for example, element 201) each separated by a rounded recessed portion (for example, element 202). In another embodiment of the structure, each protrusion can have a height (for example, element 210) between about 0.05 microns and about 3 microns. In an additional embodiment of the structure each protrusion can have a height of about 2 microns. In a further embodiment of the structure the Ohmic electrode can be a source electrode of a High Electron Mobility Transistor. In a still further embodiment of the structure the Ohmic electrode is a drain electrode of a High Electron Mobility Transistor. In another embodiment the structure of the channel-forming layer can be GaN. In yet another embodiment of the structure the Ohmic electrode can comprise one or more of titanium, titanium nitride, aluminum, nickel, platinum, gold, and tungsten.

Those skilled in the art will also appreciate that according to another embodiment, a semiconductor device (for example, element 10) comprises a first layer (for example, element 19) and a second layer (for example, element 21) over the first layer, the first and second layers configured to form an electron gas layer (for example, element 22) at an interface of the first and second layers; a first Ohmic contact (for example, element 37); and a first recess-structured conductive contact (for example, element 371) extending into the second layer, the first recess-structured conductive contact configured to electrically couple the first Ohmic contact to the electron gas layer, the first recess-structured conductive contact having a side surface with a wavy shape (for example, element 3715) configured to increase current density through the first Ohmic contact, the wavy shape having generally rounded protrusions (for example, element 201) and generally rounded recessed portions (for example, element 202).

Those skilled in the art will also appreciate that according to another embodiment, the structure can further comprise a second Ohmic contact (for example, element 36); and a second recess-structured conductive contact (for example, element 376) extending into the second layer, the second recess-structured conductive contact configured to electrically couple the second Ohmic contact to the electron gas layer, the second recess-structured conductive contact having a side surface with a wavy shape (for example, element 3715) configured to increase current density through the second Ohmic contact, and a control electrode (for example, element 27) disposed over the second layer between the first and second ohmic contacts. In a further embodiment of the structure the first layer comprises Group III-nitride buffer (for example, element 17) and channel layers; the second layer comprises a Group III-nitride barrier layer; and the wavy shape of the first recess-structured conductive contact is asymmetrical (for example, element 30) to the wavy shape of the second recess-structured conductive contact.

Those skilled in the art will also appreciate that according to still another embodiment, a method for forming a semiconductor device comprises providing a semiconductor substrate (for example, element 11) having a channel-forming layer (for example, element 19) on a major surface of the semiconductor substrate and a barrier layer (for example, element 21) on the channel-forming layer, wherein a two-dimensional electron gas layer (for example, element 22) formed at an interface between the barrier layer and the channel-forming layer; forming a first recess-structured Ohmic electrode (for example, element 371 containing a plurality of side faces that are in Ohmic contact with the two-dimensional electron gas layer and non-parallel to a channel width direction, wherein a side (for example, element 3711) of the first recessed-structured Ohmic electrode is in Ohmic contact with the two-dimensional gas layer has a wavy shape (for example, element 3715) defined by a plurality of rounded protrusions (for example, element 201) and rounded recessed portions (for example, element 202); and forming a control electrode (for example, element 27) proximate to the barrier layer.

Those skilled in the art will also appreciate that according to a further embodiment of the described method, the method can further comprise forming a second recess-structured Ohmic electrode (for example, element 376) containing a plurality of side faces that are in Ohmic contact with the two-dimensional electron gas layer and non-parallel to the channel width direction, wherein a side (for example, element 3761) of the second recess-structured Ohmic electrode in Ohmic contact with the two-dimensional gas layer has a wavy shape defined by a plurality of rounded protrusions and rounded recessed portions. In a further embodiment, the method can include forming the first and second recess-structured Ohmic electrodes each wavy shape facing each other and offset from each other.

In view of all the above, it is evident that a novel structure and method is disclosed. Included in one embodiment, among other features, is heterostructure with a Group III-nitride channel layer and a Group III-nitride barrier layer that forms a two-dimensional electron gas layer at an interface between the two layers. The current carrying electrodes are configured to have a recess-structured conductive contact adjoining and making Ohmic contact with the two-dimensional electron gas layer. One or both of the recess-structured conductive contacts has a leading edge non-parallel to a channel width direction, the leading edge defined to have a wavelike form having generally rounded peaks and valleys. Among other things, this wavelike form increases the surface area of the contact used for current conduction thereby reducing contact resistance and increasing current density. Also, the generally rounded peaks and valleys configuration produced an unexpected result of minimizing high electric field formation and current crowding around the contacts and reducing hot spot formation compared to related devices that use square wave, saw-tooth wave, or other shapes that have surfaces with sharp corners or points.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

We claim:

1. A semiconductor device comprising:
   a channel-forming layer on a semiconductor substrate;
   a barrier layer on the channel-forming layer;
   a two-dimensional electron gas layer formed at an interface between the barrier layer and the channel-forming layer;
   a control electrode adjacent the barrier layer; and
   a first recess-structured Ohmic electrode containing a plurality of side faces that are in Ohmic contact with the two-dimensional electron gas layer and non-parallel to a channel width direction, wherein a side of the first recess-structured Ohmic electrode in Ohmic contact with the two-dimensional gas layer has a wavy shape defined by a plurality of rounded protrusions each separated by a rounded recessed portion, wherein:
   each rounded protrusion has a height and a width that are substantially equal.

2. The semiconductor device of claim 1 further comprising a gate dielectric layer between the control electrode and the barrier layer.

3. The semiconductor device of claim 1 further comprising a second recess-structured Ohmic electrode containing a plurality of side faces that are in Ohmic contact with the two-dimensional electron gas layer and non-parallel to the channel width direction, wherein a side of the second recess-structured Ohmic electrode in Ohmic contact with the two-dimensional gas layer has a wavy shape defined by a plurality of rounded protrusions each separated by a rounded recessed portion.

4. The semiconductor device of claim 3, wherein the side surface of the first recess-structured Ohmic electrode having the wavy shape and the side surface of the second recess-structured Ohmic electrode having the wavy shape face each other.

5. The semiconductor device of claim 4, wherein the wavy shape of the first recess-structured Ohmic electrode is symmetrical to the wavy shape of the second recess-structured Ohmic electrode.

6. The semiconductor device of claim 4, wherein the wavy shape of the first recess-structured Ohmic electrode is offset asymmetrical to the wavy shape of the second recess-structured Ohmic electrode.

7. The semiconductor device of claim 1, wherein the first recess-structured Ohmic electrode has a continuous and generally rectangular shape.

8. The semiconductor device of claim 1, wherein each protrusion has a height between about 0.05 microns and about 3 microns.

9. The semiconductor device of claim 8, wherein the height is about 2 microns.

10. The semiconductor device according to claim 1, wherein the Ohmic electrode is a source electrode of a High Electron Mobility Transistor.

11. The semiconductor device according to claim 1, wherein the Ohmic electrode is a drain electrode of a High Electron Mobility Transistor.

12. The semiconductor device according to claim 1, wherein the channel-forming layer comprises GaN.

13. The semiconductor device according to claim 1, wherein the Ohmic electrode comprises one or more of titanium, titanium nitride, aluminum, nickel, platinum, gold, and tungsten.

14. A semiconductor device comprising:
a first layer;
a second layer over the first layer, the first and second layers configured to form an electron gas layer at an interface of the first and second layers;
a first Ohmic contact;
a first recess-structured conductive contact extending into the second layer, the first recess-structured conductive contact configured to electrically couple the first Ohmic contact to the electron gas layer, the first recess-structured conductive contact having a side surface with a wavy shape configured to increase current density through the first Ohmic contact, the wavy shape having generally rounded protrusions and generally rounded recessed portions;
a second Ohmic contact;
a second recess-structured conductive contact extending into the second layer, the second recess-structured conductive contact configured to electrically couple the second Ohmic contact to the electron gas layer, the second recess-structured conductive contact having a side surface with a wavy shape having generally rounded protrusions and generally rounded recessed portions; and
a control electrode disposed over the second layer between the first and second Ohmic contacts, wherein:
the wavy shape of the first recess-structured Ohmic electrode and the wavy shape of the second recess-structured Ohmic electrode face each other and are offset from each other.

15. The semiconductor device of claim 14, wherein:
the first layer comprises Group III-nitride buffer and channel layers;
the second layer comprises a Group III-nitride barrier layer; and
the wavy shape of the first recess-structured conductive contact is asymmetrical to the wavy shape of the second recess-structured conductive contact.

16. A method of forming a semiconductor device comprising:
providing a semiconductor substrate having a channel-forming layer on a major surface of the semiconductor substrate and a barrier layer on the channel-forming layer, wherein a two-dimensional electron gas layer is formed at an interface between the barrier layer and the channel-forming layer;
forming a first recess-structured Ohmic electrode containing a plurality of side faces that are in Ohmic contact with the two-dimensional electron gas layer and non-parallel to a channel width direction, wherein a side of the first recess-structured Ohmic electrode in Ohmic contact with the two-dimensional gas layer has a wavy shape defined by a plurality of rounded protrusions and rounded recessed portions;
forming a second recess-structured Ohmic electrode containing a plurality of side faces that are in Ohmic contact with the two-dimensional electron gas layer and non-parallel to the channel width direction, wherein a side of the second recess-structured Ohmic electrode in Ohmic contact with the two-dimensional gas layer has a wavy shape defined by a plurality of rounded peaks and rounded valleys;
forming a control electrode proximate to the barrier layer, wherein:
forming the first and second recess-structured Ohmic electrodes includes forming each wavy shape facing each other and offset from each other.

* * * * *